United States Patent
Ajmera et al.

(10) Patent No.: US 6,602,759 B2
(45) Date of Patent: Aug. 5, 2003

(54) SHALLOW TRENCH ISOLATION FOR THIN SILICON/SILICON-ON-INSULATOR SUBSTRATES BY UTILIZING POLYSILICON

(75) Inventors: Atul C. Ajmera, Wappinger Falls, NY (US); Klaus D. Beyer, Poughkeepsie, NY (US); Dominic J. Schepis, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 09/731,620

(22) Filed: Dec. 7, 2000

(65) Prior Publication Data

US 2002/0072196 A1 Jun. 13, 2002

(51) Int. Cl.$^7$ ............................................. H01L 21/76
(52) U.S. Cl. ........................ 438/431; 438/426; 438/241; 438/243; 438/174; 438/180
(58) Field of Search .............................. 438/431, 174, 438/243, 247, 151, 164, 266, 149, 180, 294, 359, 404, 386, 697, 105, 426, 311, 601, 365

(56) References Cited

U.S. PATENT DOCUMENTS

| | | | |
|---|---|---|---|
| 4,582,565 A | 4/1986 | Kawakatsu | |
| 4,666,556 A | 5/1987 | Fulton et al. | |
| 4,671,970 A | * 6/1987 | Keiser et al. | 438/427 |
| 5,087,586 A | 2/1992 | Chan et al. | |
| 5,244,827 A | 9/1993 | Dixit et al. | |
| 5,246,537 A | 9/1993 | Cooper et al. | |
| 5,248,625 A | 9/1993 | Pasch | |
| 5,385,861 A | 1/1995 | Bashir et al. | |
| 5,387,538 A | 2/1995 | Moslehi | |
| 5,455,194 A | 10/1995 | Vasquez et al. | |
| 5,472,903 A | 12/1995 | Lur et al. | |
| 5,854,120 A | * 12/1998 | Urano et al. | 438/404 |
| 5,895,253 A | 4/1999 | Akram | |
| 5,915,191 A | 6/1999 | Jun | |
| 5,926,717 A | 7/1999 | Michael et al. | |
| 5,989,977 A | 11/1999 | Wu | |
| 6,001,705 A | 12/1999 | Zombrano | |
| 6,022,789 A | 2/2000 | Takase | |
| 6,358,785 B1 | * 3/2002 | Chittipeddi et al. | 438/174 |

* cited by examiner

*Primary Examiner*—Matthew Smith
*Assistant Examiner*—Igwe U. Anya
(74) *Attorney, Agent, or Firm*—Jay H. Anderson; Scully, Scott, Murphy & Presser (57) ABSTRACT

A method for forming an isolation trench in a silicon or silicon-on-insulator substrate is described in which a trench is formed in the semiconductor structure (containing a multiple layer structure of Si, SiO$_2$, and SiN layers) and an undoped polysilicon layer is deposited on the bottom and sidewalls of the trench and on the surface of the region adjacent to the trench. A substantial portion of the trench is left unfilled by the undoped polysilicon layer deposited. The polysilicon layer is thermally oxidized to form a thermal oxide that fills the trench and thereby avoids forming a birds-beak formation of the thermal oxide above the sidewalls of the trench. The isolation structure may be planarized by either removing the polysilicon layer from the region adjacent to the trench before oxidation or later removing the oxide from the SiN layer and adjusting height of the oxide in the trench. Alternatively, either a doped polysilicon layer or a doped SiO$_2$ layer may be formed above the silicon nitride layer before the undoped polysilicon layer is deposited. In this case, the isolation structure is heat treated prior to oxidization to drive dopants from the doped layer into the undoped polysilicon layer, thereby forming a secondarily doped polysilicon layer from the undoped polysilicon layer. The doped layers are then removed by selective wet etching and expose the silicon nitride layer prior to oxidation.

26 Claims, 5 Drawing Sheets

SHALLOW TRENCH ISOLATION FOR THIN SILICON/SILICON-ON-INSULATOR SUBSTRATES BY UTILIZING POLYSILICON

BACKGROUND

Increases in device packing densities have caused integrated circuits today to contain large quantities of both active and passive electronic devices, such as bipolar junction transistors (BJTs) or MOS devices. These devices must be electrically isolated and able to operate independently of each other to ensure so that the characteristics of individual devices remain constant despite operating conditions. Defective isolation between transistors, for example, may cause current leakage between the transistors. This leakage may result in a number of problems including latch-up (activation of a transistor as a result of feedback from neighboring transistors) and crosstalk as well as consuming a considerable amount of power. Thus, in fabrication of devices with exceedingly high (submicron) densities, electrical isolation with decreasing isolation width becomes of paramount importance.

Device isolation is usually accomplished using a few different techniques. One isolation technique uses selective/local oxidation of silicon (LOCOS), in which Si is thermally oxidized to produce lateral field oxide/$SiO_2$ regions between the active devices. In general, the LOCOS process uses a pad oxide and pad nitride as a mask and defines the LOCOS area by photoresist masking and subsequent etching of the pad oxide, pad nitride, and Si substrate. After the etch, a relatively long thermal oxidation is used to fill the recessed Si areas with field oxide. The LOCOS process is cheap and simple, but has a number of problems including the fact that the lateral growth of the oxide results in a "bird's beak" type structure which intrudes on neighboring active device structures and thereby decreases both the vertical uniformity of the structure and the precision of the isolation area. Besides these problems (e.g. the large height difference between the isolation regions and the active regions), other problems include redistribution of preimplanted dopants during heating to produce the field oxide, variations in local device and wafer level characteristics due to corresponding field oxide thickness variations between different isolation areas, and a limitation in the ultimate packing density of active devices/scalability of the integrated circuit while still effectively isolating the active devices. For these reasons and more, the LOCOS isolation technique is generally unacceptable for the increasingly complex and dense integrated circuits.

An alternate technique to isolate the active devices, motivated in part to overcome the deficiencies of the LOCOS process, is the shallow trench isolation (STI) method, which is better suited to the increased density structures due to the inherent scalability, planarity, and depth of the isolation. The STI method involves RIE (Reactive Ion Etching) etching a shallow trench in either the Si substrate or a semiconductor structure usually containing a pad oxide ($SiO_2$) layer (and which may include a passivation layer composed of $Si_3N_4$) on the silicon substrate. For a very shallow Si-on-Insulator (SOI) wafer, the trench is etched 200–500 Å into the Si until the underlying buried oxide layer of the SOI wafer is reached. The trench is then filled conventionally by chemical vapor depositing (CVD) or, more recently, high-density plasma depositing (HDP) dielectric insulating materials, and the entire trench and multiple layer semiconductor structure are subsequently planarized by chemical-mechanical polishing (CMP). For example, TEOS (Tetraethyloxysilane) and $O_2$, deposited at 600–800° C., may be used in the CVD process to fill the trench with $SiO_2$. To further simplify the STI process, a hard CMP polishing pad using cerium oxide/surfactant process may be applied without the necessity of a photolithographic step.

One serious problem with the conventional STI methods is that they use CVD-deposited (or HDP) insulating materials, which are less dense than and of general lower quality than thermally grown oxides. In addition, during wet etching processes (usually HF etched), CVD and HDP oxides are more severely eroded than thermal oxides resulting in trenches being non-uniformly filled with oxide, and, in some cases, being devoid of oxide. An alternate solution is to coat the sidewalls of the trench by thermally growing an oxide layer. This alternate solution, however, causes the active structure surrounding the trench containing Si to be consumed and creates the problem of intrusion onto the active structure surrounding the trench, similar to the bird's beak problem.

It is thus more advantageous to replace the CVD and HDP oxides by thermal oxides that do not consume the silicon trench sidewalls to solve some of these problems. To this end a relatively new process has been developed in which undoped amorphous or polycrystalline Si is deposited in the trench rather than CVD or HDP-deposited $SiO_2$. The undoped amorphous or polycrystalline Si is then heat-treated in an oxidation ambient to produce $SiO_2$. In some cases, a thin layer of $SiO_2$ is grown prior to deposition of the polysilicon. After oxidation of the polysilicon, the trench is over-filled and a layer of thermally grown $SiO_2$ coats the active semiconductor area. The entire structure, including both the active semiconductor area and the filled trench, is subsequently planarized by a chemo-mechanical polishing process (CMP). The replacement of the CVD or HDP oxides has an immediate benefit to reduce the erosion encountered in wet etching after the STI process.

Figure 1A:
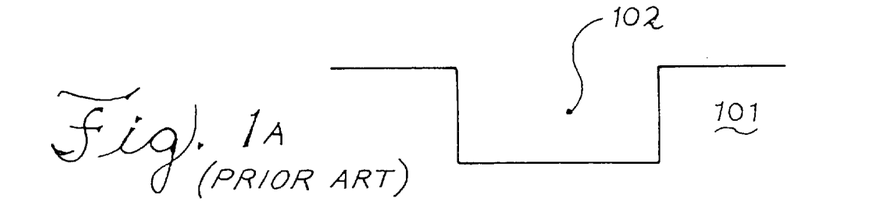
FIGS. 1A–1E illustrate a conventional STI method.
Figure 1B:
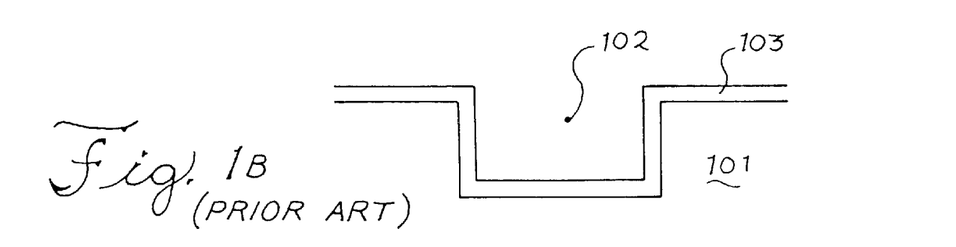
Figure 1C:
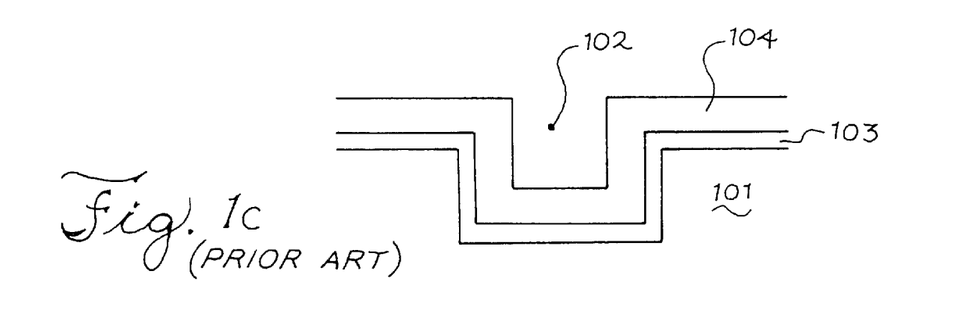
Figure 1D:
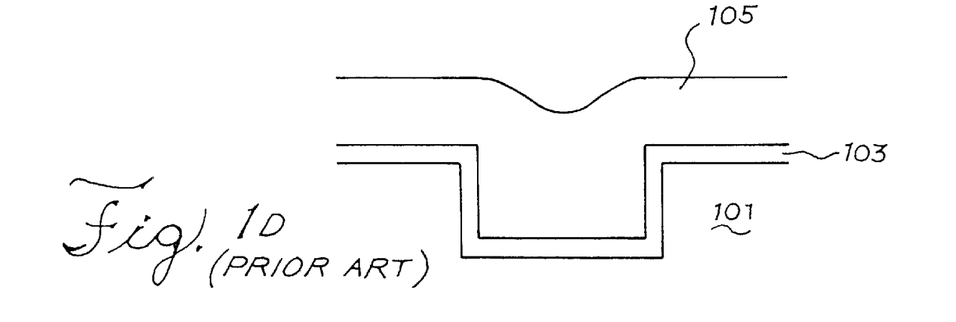
Figure 1E:
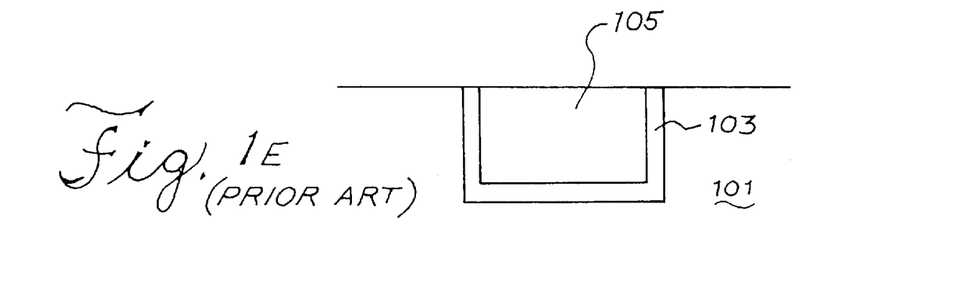

A typical process is shown in FIGS. 1A–1E. In FIG. 1A, a trench 102 is etched in the $Si_3N_4$/thin thermal $SiO_2$ passivation layer structure and into the Si to form an active Si area 101 adjacent to the trench 102. In FIG. 1B, a thin (for example, 50 Å) layer 103 of $SiO_2$ is grown from the exposed Si in the trench 102. Next, in FIG. 1C, a thicker polysilicon layer 104 of a few hundred angstroms is deposited over the thin oxide layer 103 located at the trench sidewalls. This polysilicon layer 104 is subsequently heat-treated in an oxidation ambient to produce a resultant thicker thermally grown oxide layer 105 while consuming the original polysilicon layer 104, as shown in FIG. 1D. The resultant thermally grown oxide layer 105 overfills the trench 102 (i.e. extends higher than the upper level of the $Si_3N_4$ passivation layer structure adjacent to the trench) as well as covers the surface of the thin oxide layer 103 on the active Si area 101 adjacent to the trench 102. The resultant thermally grown oxide layer 105 is then selectively removed by CMP from the surface of the $Si_3N_4$ passivation layer structure adjacent to the trench 102 and the overfill of the thermally grown oxide layer 105 in the trench 102 is then removed, i.e. the structure is planarized, as illustrated in FIG. 1E.

However, despite the improvement in device characteristics and partial mitigation of the common problems faced using the LOCOS technique described above, the conventional STI methods only help to diminish these problems, they do not alleviate them entirely. Further, current process tolerances using the conventional STI methods are approximately 200 Å, and cannot guarantee sufficient trench fill without having excessive step height between the oxide filling the trench and the active area adjacent to the trench.

For thin SOI wafers, the process thickness tolerances of either of the CVD or HDP oxides and the hard mask cerium oxide/surfactant CMP planarizing process discussed above present a severe problem. Thus, a controllable process using a thermal oxide is necessary to assuage these general, remaining problems, which include those relating to the reduction of active device area (i.e. bird's beak formation-type problems).

SUMMARY

To solve these problems, a method of isolating active devices using shallow trench isolation has been developed having increased process control and using a thermally grown oxide. The method uses selective oxidation and does not result in reduction of active device area or extensive bird's beaks formations. The use of a silicon-on-insulator substrate for active device isolation helps to further diminish the above problems. In all of the embodiments presented, the shallow trench is plugged with a thermal oxide, rather than a CVD deposited oxide.

A first aspect of the present invention is thus directed towards a method for forming an isolation trench in a semiconductor structure in which a trench is formed on a silicon-on-insulator substrate and an undoped polysilicon layer is deposited on the bottom and sidewalls of the trench and on the surface of the region adjacent to the trench. A substantial portion of the trench is left unfilled by the undoped polysilicon layer deposited. The polysilicon layer is thermally oxidized to form a thermal oxide that fills the trench and thereby avoids forming a birds-beak formation of the thermal oxide above the sidewalls of the trench.

The semiconductor structure may contain a multiple layer structure of Si, $SiO_2$, and SiN layers. The sidewalls of the trench may also be covered with a thin thermal dielectric, such as an oxide, which is then treated with one of NO, $N_2O$, and N ion implantation prior to depositing the undoped polysilicon layer.

The isolation structure, in addition, may be planarized. Planarization can be accomplished either by removing the polysilicon layer from the surface of the region adjacent to the trench before oxidation or, alternatively, by maintaining the polysilicon layer on the surface of the region adjacent to the trench but later removing the oxide from the SiN layer and adjusting height of the oxide in the trench.

A doped layer comprising doped polysilicon or doped $SiO_2$ may additionally be formed above the silicon nitride layer before the undoped polysilicon layer is deposited. In this case, the isolation structure may then be heat treated prior to oxidization to drive dopants from the doped layer into the undoped polysilicon layer, thereby forming a secondarily doped polysilicon layer from the undoped polysilicon layer. Afterwards, prior to oxidation, selective wet etching removes the doped layers and exposes the silicon nitride layer.

These and other features and advantages of the invention will become apparent upon a review of the following detailed description of the presently preferred embodiments of the invention, when viewed in conjunction with the appended drawings.

DETAILED DESCRIPTION OF THE PRESENTLY PREFERRED EMBODIMENTS

Figure 2A:
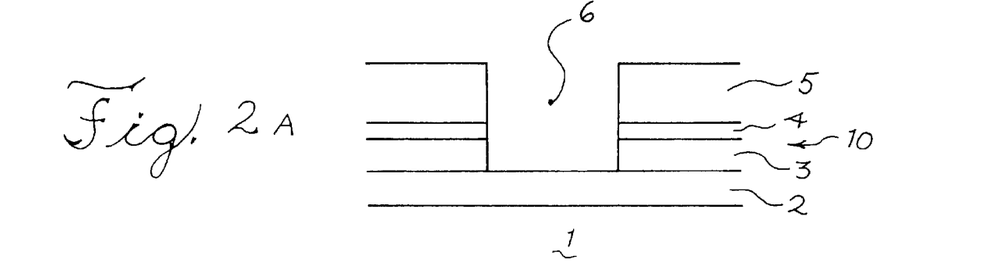
FIGS. 2A–2E illustrate an STI method according to a first embodiment.
Figure 2B:
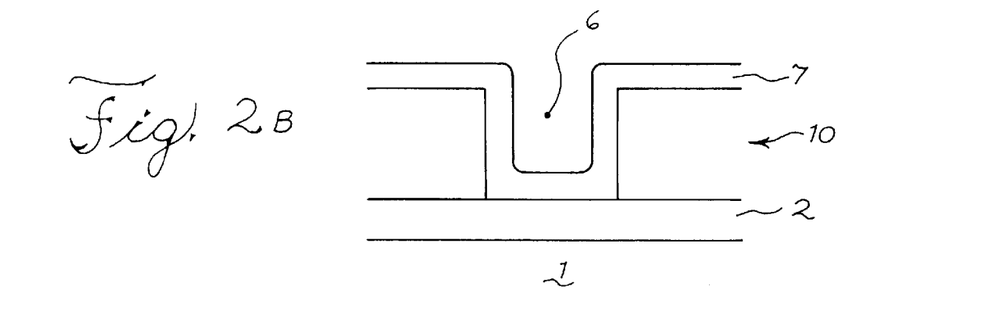
Figure 2C:
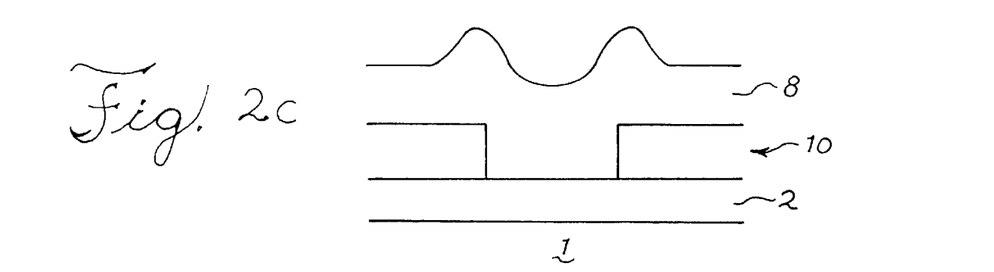

A first embodiment is described in FIGS. 2A–2C. The active device area is generally a multiple layer structure on a silicon-on-insulator substrate.

The silicon-on-insulator substrate contains bulk Si 1 and a buried oxide layer 2 (usually $SiO_2$) on the Si. As mentioned, the enhanced performance/speed is a major driving factor for using thin SOI substrates, which decrease the junction capacitance of devices present on the substrate. SOI wafers are presently produced by the commercial processes of either oxygen implantation in a Si substrate (SIMOX) with a subsequent high temperature anneal or by a wafer bonding process using H implantation. The use of a silicon-on-insulator substrate allows the buried oxide layer 2 to properly insulate and reduce capacitance between the active devices thereby improving both the high-frequency operation of the devices and integrated circuits using the devices and eliminating leakage current between devices.

In one embodiment, the multiple layer structure comprises a Si layer 3 deposited on the buried oxide layer 2, a thermally grown pad oxide ($SiO_2$) layer 4 deposited on the Si layer 3, and a passivation ($Si_3N_4$) layer 5 deposited on the pad oxide layer 4. In general, the Si layer 3 is approximately 200–700 Å thick, the $SiO_2$ layer 4 is approximately 50–80 Å thick, and silicon nitrate layer 5 is approximately 500–800 Å thick. The silicon nitride passivation layer 5 is deposited via CVD (either low pressure or high pressure), for instance. As FIG. 2A illustrates, the trench 6 is etched to the buried oxide layer 2. The trench 6 is about 1350 Å wide, and thereby generally wider than it is deep. The trench 6 is dry (plasma and/or reactive ion etch RIE) etched for uniformity. In general, the trench 6 is etched formed by standard photolithographic techniques (including coating the layers with photoresist(s) in etching the various layers, masking the photoresist, exposing the unmasked photoresist to UV or other radiation, developing the exposed photoresist, removing either the exposed or unexposed photoresist, and etching the exposed layers). Various etchants are used to etch through the various layers when using a dry etch process—fluoride containing ions and/or plasmas for thick $SiO_2$ layers (including $CHF_3$, $CF_4$, $C_2F_6$, or $C_3F_8$), other ions and/or plasmas for Si/SiN layers (including $Cl_2$, $BCl_3$, HBr, $SF_6$, $SiCl_4$, or $H_3PO_4$).

Referring to FIG. 2B, a layer of undoped polycrystalline Si 7 is deposited by LP-CVD at a temperature of about 400–560° C. using $SiH_4$ as the source gas. The undoped polycrystalline Si layer 7 covers the surfaces of the trench 6 and the upper surface of the active region adjacent to the trench 10 (comprising the silicon layer 3, pad oxide 4 and silicon nitride layer 5). The polycrystalline Si layer 7 is usually in the range of approximately 100–200 Å thick, but may be increased to about 500 Å. Of course, a photoresist mask may also be used to limit the area of deposition of the polycrystalline Si layer 7 on the surface of the active region adjacent to the trench 10, but for most applications, using the photoresist mask as above is not required. As can be seen, a substantial portion of the trench 6 is thus left unfilled after the deposition of the polycrystalline Si layer 7. This is because the thermally grown oxide layer is effectively less dense than the Si layer from which it originates and is therefore becomes larger than the original Si layer during oxidation.

Figure 2D:
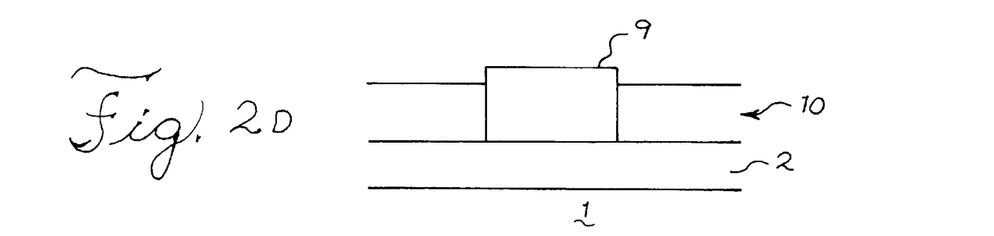
Figure 2E:
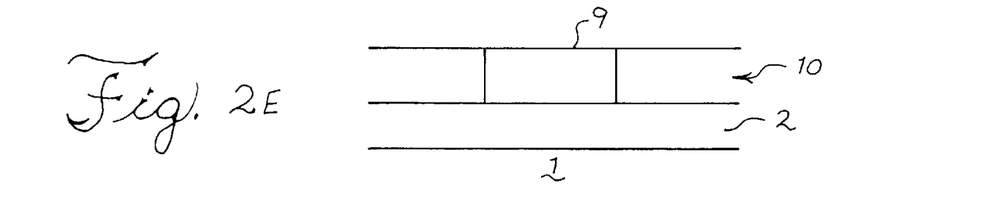

As shown in FIG. 2C, the oxidation process entirely consumes the original deposited polycrystalline Si layer 7 and creates a thermal oxide 8 layer fills the trench 6. The thermal oxidation may occur in a wet ($H_2O$) ambient or dry ($O_2$) ambient and at temperatures of from about 800° C. to about 1150° C. The thermal oxide layer 8 not only overfills the trench 6, but, in addition, covers the surface of the active region adjacent to the trench 10, similar to the polycrystalline Si layer 7. To fabricate devices on the entire structure, now that the trench 6 has been filled with the thermal oxide 8, the entire structure is generally planarized, as illustrated in FIG. 2D. In this case, a selective oxide CMP process results in the removal of the thermal oxide 8 from the surface of the active region adjacent to the trench 10, exposing the surface of the silicon nitride passivation layer 5. The CMP process typically uses a hard polishing pad (for example, IC 1000 pad) and may apply a planarization process such as the PPS process in which the slurry is premixed with the surfactant. The CMP process is selective and polishes away $SiO_2$ much faster than silicon nitride, e.g. approximately an order of magnitude faster. Thus, removal of the thermal oxide 8 occurs much more rapidly than removal of any of the silicon nitrate passivation layer 5. The final result is shown in FIG. 2E, in which both the surface of the active region adjacent to the trench 10 and the thermal oxide plug 9 filling the trench 6 are planarized to the same height. The use of the hard, thermal oxide allows for post-isolation processing/manufacturing without excessive removal of the thermal oxide from the trench.

Figure 3A:
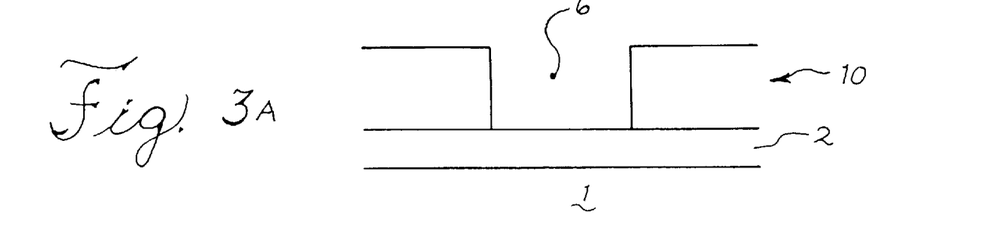
FIGS. 3A–3E illustrate an STI method according to a second embodiment.
Figure 3B:
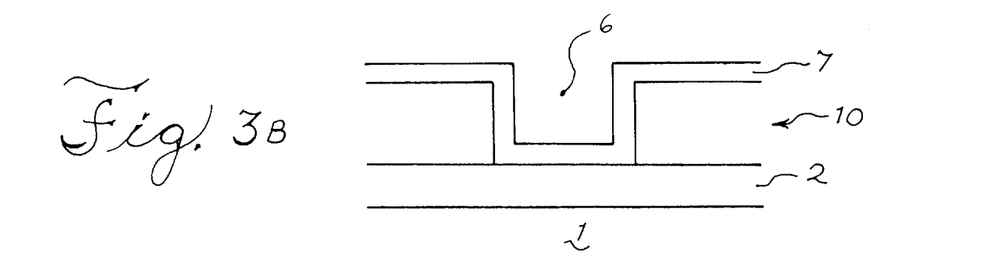
Figure 3C:
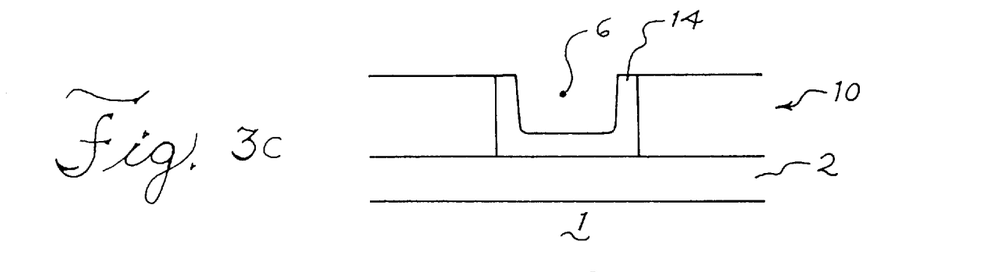

An alternate embodiment of using STI to isolate active semiconductor regions is shown in FIGS. 3A–3E. In this alternate embodiment, the method is initially similar to the embodiment above, as shown by FIGS. 3A and 3B, which are similar to FIGS. 2A and 2B. Thus, as above, a trench 6 is RIE etched and/or plasma etched to the buried oxide layer 2 and a layer of undoped polycrystalline Si 7 is deposited by CVD on the trench 6 and the surface of the silicon nitride layer 5 in the active region adjacent to the trench 10. The thicknesses of the layers are the same as the first embodiment. However, after the polycrystalline Si layer 7 is deposited, the alternate embodiment diverges and deposited polycrystalline Si is removed from the surface of the silicon nitride layer 5 in the active region adjacent to the trench 10 by a CMP process consisting of using a slurry with KOH or other comparable reactant having a PH value of around 11. This is shown in FIG. 3C, in which only deposited polycrystalline Si 14 in the trench 6 remains.

Figure 3D:
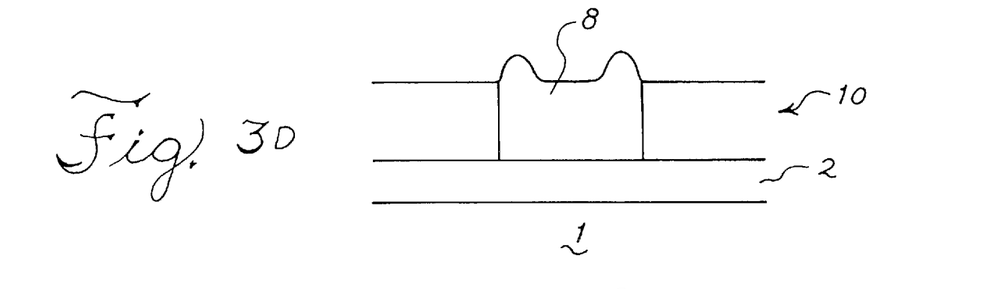
Figure 3E:
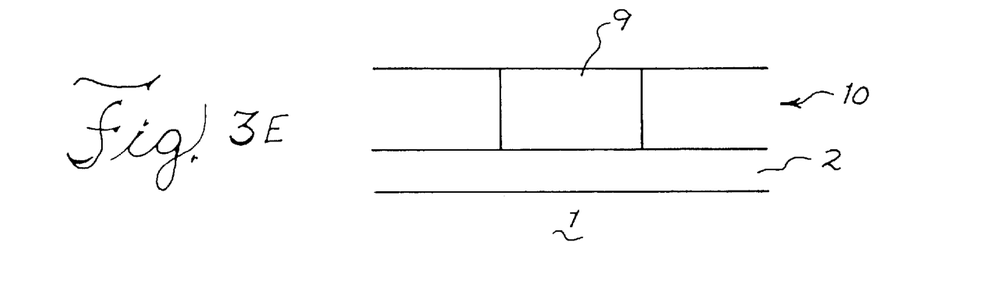

Subsequent to the CMP removal of the deposited polycrystalline Si from the surface of the silicon nitride layer 5 in the active region adjacent to the trench 10, the deposited polycrystalline Si 14 remaining in the trench 6 is oxidized. The oxidation conditions are similar to the first embodiment, i.e. in wet or dry ambient at temperatures of about 800° C. to about 1100° C. The thermal oxide 8 formed from the deposited polycrystalline Si 14 in the trench 6 fills the trench 6 and creates oxide "ears" near the top corners of the sidewalls of the trench 6, as illustrated in FIG. 3D. Note that the ears may actually be desirable in some applications as they provide lateral protection during wet etching performed subsequently. The ears can be removed by another CMP process (and perhaps an additional etch process) to planarize the entire structure such that the surface of the active region adjacent to the trench 10 and the surface of the thermal oxide 8 filling the trench 6 are fabricated to the same height (to form the thermal oxide plug 9), as shown in FIG. 3E. This process is generally very controllable as the CMP process for the removal of polysilicon (the basic slurry) is very selective to polycrystalline Si (i.e. by two orders of magnitude in comparison to the underlying silicon nitride passivation layer 5) and, thus, in polishing the polycrystalline Si prior to oxidation, the polishing pad cannot reach the polycrystalline Si deposited in the trench 6 if a hard polishing pad like IC 1000 is applied.

A third method of using STI to isolate active semiconductor regions, but does not use a CMP process to form the shallow trench isolation, is shown in FIGS. 4A–4F. In this method, similar to the other embodiments, a trench 6 is etched in a multiple layer structure 11. However, unlike the other embodiments, the multiple layer structure 11 comprises not only a Si layer 3 deposited on the buried oxide layer 2, a pad oxide layer 4 deposited on the Si layer 3, and a silicon nitride layer 5 deposited on the pad oxide layer 4, but also a doped polycrystalline Si layer 12 deposited on the silicon nitride layer 5. The doped polycrystalline Si layer 12 may be formed by direct deposition on the silicon nitride layer 5. The doped polycrystalline Si layer 12 may additionally be formed by deposition of an undoped polycrystalline Si layer on the silicon nitride layer 5 and subsequent implantation of dopants in the undoped polycrystalline Si layer and heat-treatment the implanted polycrystalline Si layer to activate the dopants. The heat treatment consists of annealing the structure in a $N_2$ or Ar ambient at an approximate temperature range of 800–900° C. This is somewhat lower than the standard temperature used to anneal dopants in bulk Si as the multiplicity of grain boundaries in polycrystalline Si aid in the diffusion of the dopants such that the dopants diffuse much faster at a given temperature. The doped polycrystalline Si layer 12 is usually about a few hundred angstroms thick. Common dopants implanted or otherwise present in the doped polycrystalline Si layer 12 include for example boron, arsenic, and phosphorous. Note that the diffusion of a particular dopant through the polycrystalline Si layer 12 is also dependent on the dopant itself (for example B and P diffuse relatively an order of magnitude faster than As), which will affect the temperature of the heat treatment. The silicon nitride layer 5 essentially blocks the dopants from redistributing into the pad oxide layer 4 or Si layer 3.

Figure 4A:
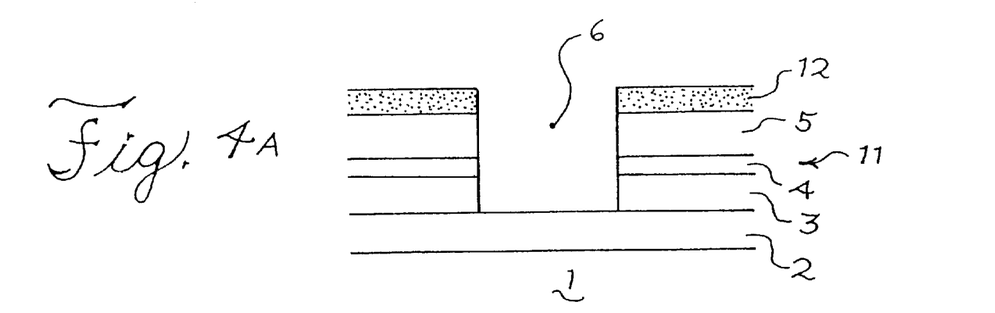
FIGS. 4A–4F illustrate an STI method according to a third embodiment.
Figure 4B:
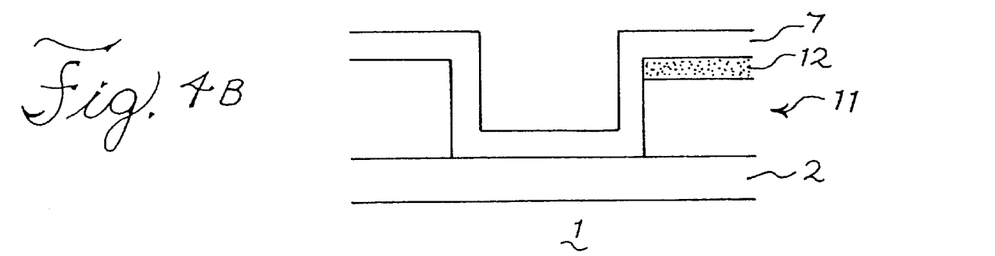

The doped polycrystalline Si layer 12 contained in the multiple layer structure is then RIE and/or plasma etched to the buried oxide layer 2 to form the trench 6, as shown in FIG. 4A. FIG. 4B depicts the entire structure after deposition of the undoped polycrystalline Si layer 7 using CVD on the trench 6 and the surface of the doped polycrystalline Si layer 12 in the active region adjacent to the trench 11. The thickness of the undoped polycrystalline Si layer 7 is about the same as in the first embodiment.

Figure 4C:
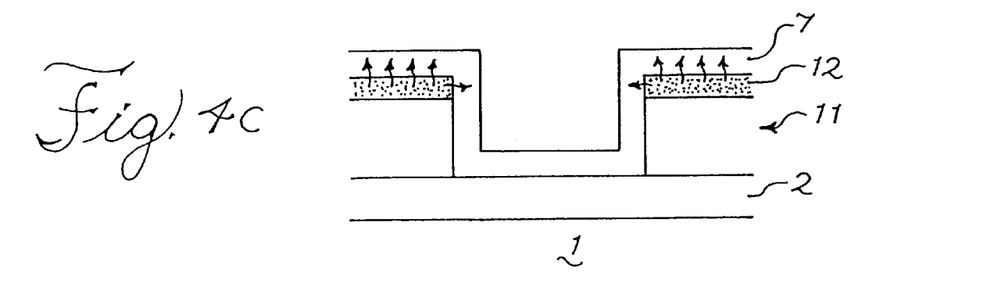
Figure 4D:
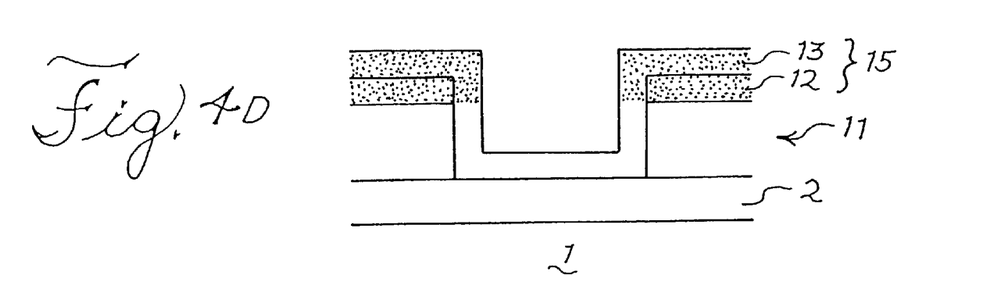

After the undoped polycrystalline Si layer 7 has been deposited, the structure is subjected to a short heat treatment, as shown in FIG. 4C, such that the dopants from the doped polycrystalline Si layer 12 are driven into adjacent parts of the undoped polycrystalline Si layer 7. The heat treatment, as above, consists of annealing the structure in a $N_2$ or Ar ambient at an approximate temperature range of 800–900° C. The heat treatment results in a newly formed larger volume of doped polycrystalline Si (both the original doped polycrystalline Si layer 12 and the original undoped polycrystalline Si layer 7 are now doped). The dopants diffuse relatively uniformly from the original doped polycrystalline Si layer 12 into the adjacent original undoped polycrystalline Si layer 7. Thus, as illustrated in FIG. 4D, essentially dopants diffuse into both the original undoped polycrystalline Si layer 7 deposited above the doped polycrystalline Si layer 12 and the original undoped polycrystalline Si layer 7 deposited in the trench 6 above the height level of the silicon nitride layer 5. However, the time used for the diffusion of the dopants from the original doped polycrystalline Si layer 12 into the adjacent original undoped polycrystalline Si layer 7 is adjusted such that the dopants do not diffuse significantly into the original undoped polycrystalline Si layer 7 deposited in the trench 6 below the height level of the silicon nitride layer 5. Thus, for example, if the original undoped polycrystalline Si layer 7 deposited above the doped polycrystalline Si layer 12 were 200 Å thick, the time the heat treatment is applied would not exceed about the time it would take to diffuse the particular dopant 200 Å in polycrystalline Si, perhaps being 50% longer to assure complete diffusion into the original undoped polycrystalline Si layer 7 deposited above the doped polycrystalline Si layer 12. The doped polycrystalline Si layer formed from the original undoped polycrystalline Si layer 7 will be referred to as a secondarily doped polycrystalline Si layer 13.

Figure 4E:
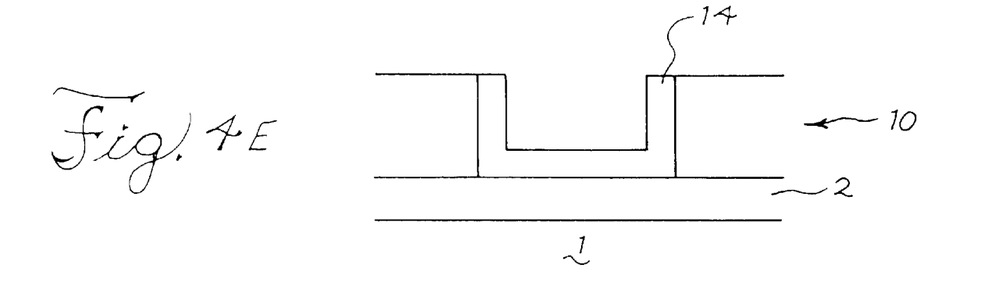

The entire amount of doped polycrystalline Si 15, both the original doped polycrystalline Si layer 12 and the secondarily doped polycrystalline Si layer 13, is then removed using a selective wet etch. The selective wet etch may comprise a HF:HNO$_3$ mixture having a very small proportion of HF, i.e. about a ratio 1:50 or less, preferably 1:100 to 1:200. Ratios of 1:100 to 1:200 in the HF:HNO$_3$ mixture can give at least an order of magnitude ratio between the etch rate of doped polycrystalline Si and that of undoped polycrystalline Si, dependent on the dopant. Dry etch processes, such as RIE, do not provide such a large etching difference as they are not as dependent on dopants and thus, in this case, are inferior to a wet etch. As FIG. 4E shows, only the undoped polycrystalline Si 14 deposited in the trench 6 remains after the wet etch; the surface of the silicon nitride layer 5 is exposed prior to oxidation of the undoped polycrystalline Si 14, similar to the second embodiment above. This occurs because the wet etch used etches doped polycrystalline Si much more quickly than undoped polycrystalline Si. Thus, while the total doped polycrystalline Si 15 is removed, only a small portion of the undoped polycrystalline Si layer 7 is etched.

Figure 4F:
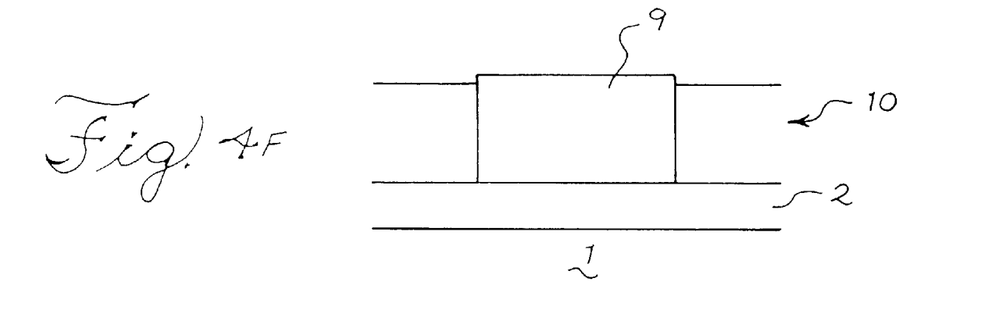

After the selective etching, the remaining undoped polycrystalline Si 14 in the trench 6 is oxidized under conditions similar to those of the second embodiment. The result is a thermal oxide plug 9 disposed in the trench 6 and exposed silicon nitride in the active region adjacent to the trench 10, as shown in FIG. 4F, much like that of the second embodiment. In addition, using the third embodiment, the ears may not be as pronounced as those in the second embodiment. Conspicuously absent, in using the third embodiment, is the CMP process. This both reduces the cost and increases control over the overall process, the latter because only uncertainty over the thickness of the undoped polycrystalline Si layer 14 remains.

Alternatively, in the third embodiment, because the CMP process is absent, the original doped polycrystalline Si layer 12 may be replaced with either a doped CVD or HDP SiO$_2$ layer. No matter whether a doped SiO$_2$ layer is used rather than the original doped polycrystalline Si layer 12, the doped SiO$_2$ layer is selectively etched using a HF:HNO$_3$ etch and similar process parameters as the HF/HNO$_3$ etch used to etch the entire doped polycrystalline Si layer 15 described above.

Figure 5:
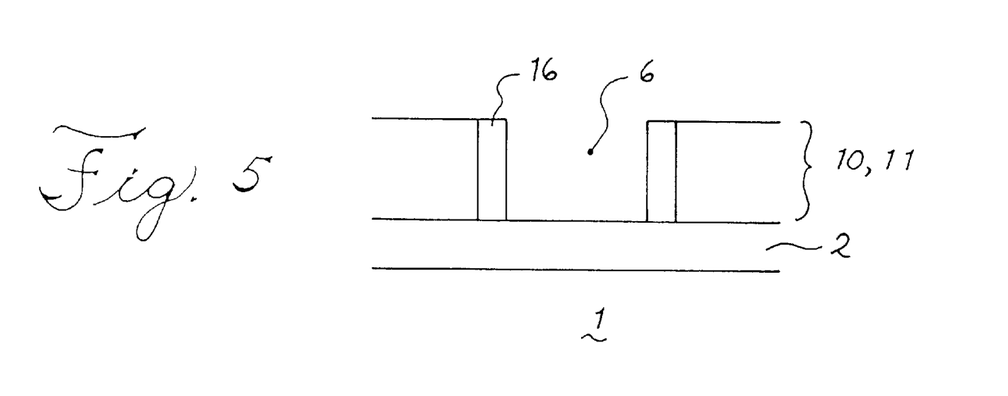
FIG. 5 illustrates an alternate embodiment of the shallow trench after covering the sidewalls of the trench with the thin dielectric.

In addition, FIG. 5 depicts an embodiment in which the sidewalls of the trench 6 are covered with a thin dielectric layer 16 prior to deposition of the undoped polycrystalline Si layer 7. The covering of the sidewalls of the trench 6 with the thin dielectric layer 16 may occur in any of the above embodiments prior to the deposition of the undoped polycrystalline Si layer 7 in each embodiment. Thermal oxidation is used to cover the sidewalls of the trench 6 with the thin dielectric layer 16. Typical process parameters of this thermal oxidation include a 30–200 second Rapid Thermal Oxidation (RTO) at 1150° C., the temperature at which the silicon-based glass starts flowing, thereby alleviating much of the stress caused by the SiO$_2$. The thin dielectric layer 16 is usually in the range of about 20 to 300 Å thick and may comprise treating a thermal oxide containing NO or N$_2$O at an elevated temperature of about 1150° C. The thin dielectric layer 16 may also comprise ion implanted N and may be subsequently annealed at an elevated temperature of about 1150° C. in inert ambients such as a N$_2$ ambient. After the sidewalls of the trench 6 are covered with the thin dielectric layer 16, the various embodiments of the invention proceed as explained before.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

We claim:

1. A method for forming an isolation trench in a semiconductor structure having a silicon-on-insulator substrate comprising:

forming a trench having a bottom and sidewalls in the semiconductor structure;

depositing an undoped polysilicon layer on the bottom and the sidewalls of the trench and on a surface of a semiconductor region adjacent to the trench, said semiconductor region adjacent to the trench comprising a multiple layer structure that includes a silicon layer, a pad oxide layer above the silicon layer, a silicon nitride layer above the pad oxide layer, and a doped polysilicon layer above the silicon nitride layer, all layers of the multiple layer structure residing above a level of the bottom of the trench, the undoped polysilicon layer deposited such that a substantial portion of the trench is left unfilled; and oxidizing the undoped polysilicon layer to form a thermal oxide that fills the trench and thereby avoids forming a birds-beak formation of the thermal oxide above the sidewalls of the trench and avoids reduction in active device area in said adjacent semiconductor region.

2. The method of claim 1, the oxidizing further forming extended portions of the thermal oxide proximate to and above the sidewalls of the trench.

3. The method of claim 1, further comprising planarizing the semiconductor structure prior to oxidizing the polysilicon layer to remove the polysilicon layer from the surface of the semiconductor region adjacent to the trench and to adjust the polysilicon layer in the trench such that the polysilicon layer in the trench does not extend above the surface of the semiconductor region adjacent to the trench.

4. The method of claim 1, further comprising removing the thermal oxide from the surface of the semiconductor region adjacent to the trench using a chemo-mechanical polishing process.

5. The method of claim 4, further comprising planarizing the semiconductor structure by selectively etching the thermal oxide and the surface of the semiconductor region adjacent to the trench subsequent to the chemo-mechanical polishing process such that the thermal oxide is planar with the semiconductor region adjacent to the trench.

6. The method of claim 1, further comprising:
heat treating the semiconductor region adjacent to the trench prior to oxidizing to drive dopants from the doped polysilicon layer into the undoped polysilicon layer, thereby forming a secondarily doped polysilicon layer from the undoped polysilicon layer; and
removing the doped polysilicon layer and the secondarily doped polysilicon layer to expose the silicon nitride layer.

7. The method of claim 6, wherein the removing comprises selectively wet etching the doped polysilicon layer and the secondarily doped polysilicon layer.

8. The method of claim 1, further comprising forming a doped $SiO_2$ layer above the silicon nitride layer.

9. The method of claim 8, further comprising:
heat treating the semiconductor region adjacent to the trench prior to oxidizing to drive dopants from the doped $SiO_2$ layer into the undoped polysilicon layer, thereby forming a doped polysilicon layer from the undoped polysilicon layer; and
removing the doped $SiO_2$ layer and the doped polysilicon layer to expose the silicon nitride layer.

10. The method of claim 1, further comprising covering the sidewalls of the trench with a thin dielectric structure prior to depositing the undoped polysilicon layer.

11. The method of claim 10, further comprising treating the thin dielectric structure with one of NO, $N_2O$, and N ion implantation and subsequently heat treating the implanted thin dielectric structure prior to depositing the undoped polysilicon layer.

12. The method of claim 1, further comprising covering the sidewalls of the trench with a thin thermal oxynitride dielectric film prior to depositing the undoped polysilicon layer.

13. The method of claim 1, further comprising etching the trench to have a width of the trench of about 1350 Å, the forming of the multiple layer structure comprising:
depositing from about 200 Å to about 700 Å of silicon to form the silicon layer;
forming the pad oxide layer to be from about 50 Å to about 80 Å; and
depositing from about 500 Å to about 800 Å of silicon nitride to form the silicon nitride layer.

14. The method of claim 13, wherein the depositing of the undoped polysilicon layer comprises depositing from about 100 Å to about 200 Å of undoped polysilicon to form the undoped polysilicon layer.

15. A method for forming an isolation trench in a semiconductor structure on a silicon-on-insulator substrate comprising;
forming the semiconductor structure to be a multiple layer structure including a silicon layer, a pad oxide layer above the silicon layer, a silicon nitride layer above the pad oxide layer, and one of a doped polysilicon layer and a doped $SiO_2$, layer above the silicon nitride layer
forming a trench having a bottom and sidewalk in the semiconductor structure;
depositing an undoped polysilicon layer on the bottom and the sidewalk of the trench and on a surface of a region of the semiconductor structure adjacent to the trench, the undoped polysilicon layer being deposited such that a substantial portion of the trench is left unfilled;

heat treating the region adjacent to the trench to drive dopants from the one of the doped polysilicon layer and the doped $SiO_2$ layer into the undoped polysilicon layer thereby forming a secondarily doped polysilicon layer from the undoped polysilicon layer
wet etching the secondarily doped polysilicon layer and the one of the doped polysilicon layer and the doped $SiO_2$ layer to remove the secondarily doped polysilicon layer and the one of the doped polysilicon layer and the doped $SiO_2$, layer and to expose the silicon nitride layer and
subsequently oxidizing the polysilicon layer to form a thermal oxide that fills the trench and thereby avoids forming a birds-beak formation of the thermal oxide above the sidewalls of the trench and avoids reduction in active device area in said adjacent semiconductor region.

16. The method of claim 15, further comprising planarizing the semiconductor structure and trench prior to oxidizing the polysilicon layer to remove the polysilicon layer from the surface of the region adjacent to the trench and to adjust the polysilicon layer in the trench such that the polysilicon layer in the trench does not extend above the surface of the silicon-on-insulator substrate adjacent to the trench.

17. The method of claim 15, further comprising removing the thermal oxide from the surface of the region adjacent to the trench using a chemo-mechanical polishing process.

18. The method of claim 17, further comprising planarizing the semiconductor structure by etching the thermal oxide and the surface of the region adjacent to the trench subsequent to the chemo-mechanical polishing process such that the thermal oxide is planar with the surface of the region adjacent to the trench.

19. The method of claim 15,
the forming of the multiple layer structure comprising:
depositing from about 200 Å to about 700 Å of silicon to form the silicon layer;
forming the pad oxide layer to be from about 50 Å to about 80 Å; and
depositing from about 500 Å to about 800 Å of silicon nitride to form the silicon nitride layer; and
the forming of the trench comprising etching a width of the trench to be about 1350 Å.

20. The method of claim 15, the depositing of the undoped polysilicon layer comprising depositing from about 100 Å to about 500 Å of undoped polysilicon to form the undoped polysilicon layer.

21. The method of claim 15, the depositing of the undoped polysilicon layer comprising depositing from about 100 Å to about 200 Å of undoped polysilicon to form the undoped polysilicon layer.

22. A method for forming an isolation trench in a semiconductor structure on a silicon substrate comprising:
forming the semiconductor structure to be a multiple layer structure including a pad oxide layer above the silicon layer, and a silicon nitride layer above the pad oxide layer;
forming a trench having a bottom and sidewalls in the semiconductor structure;
depositing an undoped polysilicon layer on the bottom and the sidewalls of the trench and on a surface of a region of the semiconductor structure adjacent to the trench, the undoped polysilicon layer being deposited such that a substantial portion of the trench is left unfilled;

forming one of a doped polysilicon layer and a doped $SiO_2$ layer above the silicon nitride layer;

heat treating the region adjacent to the trench prior to oxidizing to drive dopants from the one of the doped polysilicon layer and the doped $SiO_2$ layer into the undoped polysilicon layer, thereby forming a secondarily doped polysilicon layer from the undoped polysilicon layer;

wet etching the secondarily doped polysilicon layer and the one of the doped polysilicon layer and the doped $SiO_2$ layer to remove the secondarily doped polysilicon layer and the one of the doped polysilicon layer and the doped $SiO_2$ layer and to expose the silicon nitride layer; and oxidizing the polysilicon layer to form a thermal oxide that fills the trench and thereby avoids forming a birds-beak formation of the thermal oxide above the sidewalls of the trench.

23. The method of claim 22, further comprising planarizing the semiconductor structure by etching the thermal oxide and the surface of the region adjacent to the trench subsequent to the chemo-mechanical polishing process such that the thermal oxide is planar with the surface of the region adjacent to the trench.

24. The method of claim 22,
the forming of the multiple layer structure further comprising:
forming the pad oxide layer to be from about 50 Å to about 80 Å; and
depositing from about 500 Å to about 800 Å of silicon nitride to form the silicon nitride layer; and
the forming of the trench comprising etching a width of the trench to be about 1350 Å.

25. The method of claim 22, the depositing of the undoped polysilicon layer comprising depositing from about 100 Å to about 500 Å of undoped polysilicon to form the undoped polysilicon layer.

26. The method of claim 22, the depositing of the undoped polysilicon layer comprising depositing from about 100 Å to about 200 Å of undoped polysilicon to form the undoped polysilicon layer.

* * * * *